United States Patent
Molina et al.

(10) Patent No.: US 7,151,414 B2
(45) Date of Patent: Dec. 19, 2006

(54) METHOD AND CIRCUIT FOR FREQUENCY SYNTHESIS USING A LOW DRIFT CURRENT CONTROLLED OSCILLATOR WITH WIDE OUTPUT FREQUENCY RANGE

(75) Inventors: Johnnie Molina, Tucson, AZ (US);
Hugo Cheung, Tucson, AZ (US);
Rituparna Ghosh, Tucson, AZ (US);
Ramesh Saripalli, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 46 days.

(21) Appl. No.: 11/044,665

(22) Filed: Jan. 26, 2005

(65) Prior Publication Data

US 2006/0164174 A1   Jul. 27, 2006

(51) Int. Cl.
*H03L 7/085* (2006.01)
(52) U.S. Cl. .......................................... 331/17; 331/25
(58) Field of Classification Search ................ 331/1 A, 331/8, 10, 17, 18, 25, 57, 111, 143, 177 R, 331/179
See application file for complete search history.

(56) References Cited

U.S. PATENT DOCUMENTS

| | | | | |
|---|---|---|---|---|
| 5,142,249 A | * | 8/1992 | Hirotomi | ..................... 331/57 |
| 5,459,653 A | * | 10/1995 | Seto et al. | ..................... 363/73 |
| 6,005,444 A | * | 12/1999 | Carpelan | ..................... 331/16 |
| 6,114,920 A | * | 9/2000 | Moon et al. | ................. 331/179 |
| 6,404,294 B1 | * | 6/2002 | Sha et al. | ..................... 331/57 |

* cited by examiner

*Primary Examiner*—David Mis
(74) *Attorney, Agent, or Firm*—Carlton H. Hoel; W. James Brady, III; Frederick J. Telecky, Jr.

(57) ABSTRACT

A method and circuit for frequency synthesis using a low drift current controlled oscillator configured to provide a wide output frequency and high accuracy are provided. An exemplary frequency synthesis circuit is configured for programmable control of a center frequency of the current controlled oscillator to provide a wide range of output frequencies with high accuracy. In accordance with an exemplary embodiment of the present invention, an exemplary circuit comprises a phase-locked loop (PLL) circuit comprising a phase detector, a charge pump, a current controlled oscillator and a divider circuit. For programmable control of the current controlled oscillator, the PLL circuit further comprises a trim digital-to-analog converter (DAC) configured to provide a trimmed current signal for control of the current controlled oscillator. In accordance with an exemplary embodiment of the present invention, trim values for operation of the trim DAC can be suitably located within a trim register of flash memory, such as programmable flash memory within any mixed-signal device or system.

21 Claims, 2 Drawing Sheets

METHOD AND CIRCUIT FOR FREQUENCY SYNTHESIS USING A LOW DRIFT CURRENT CONTROLLED OSCILLATOR WITH WIDE OUTPUT FREQUENCY RANGE

FIELD OF INVENTION

The present invention relates to frequency synthesis within integrated circuits. More particularly, the present invention relates to a method and circuit for frequency synthesis using a low drift current controlled oscillator to provide a wide output frequency range.

BACKGROUND OF THE INVENTION

While both oscillator devices and phase-locked loop (PLL) circuits are used for frequency synthesis in generating output clock signals, internal oscillator circuits typically differ from PLL circuits in the stability or drift of the output frequency. For example, while PLL circuits are able to lock certain frequencies under the majority if not all conditions of temperature and power supply variations, internal oscillators generally suffer from frequency drift over the given temperature range. In addition to failing to produce the level of accuracy for PLL generated clock circuits, internal oscillator circuits typically have a limited frequency range.

Attempts to address the limitations of oscillator circuits typically include the use of external clocks and/or crystals, e.g., using an on-chip PLL circuit as a clock source. Such techniques come at a significant cost of silicon area, as well as requiring complex analog circuitry, such as the use of loop filters and highly accurate external clock sources, to make such a circuit operate properly.

SUMMARY OF THE INVENTION

In accordance with various aspects of the present invention, a method and circuit for frequency synthesis using a low drift current controlled oscillator configured to provide a wide output frequency and high accuracy are realized. An exemplary frequency synthesis circuit is configured for programmable control of a center frequency of the current controlled oscillator to provide a wide range of output frequencies with high accuracy.

In accordance with an exemplary embodiment of the present invention, an exemplary circuit comprises a phase-locked loop (PLL) circuit comprising a phase detector, a charge pump, a current controlled oscillator and a divider circuit. For programmable control of the current controlled oscillator, the PLL circuit further comprises a trim digital-to-analog converter (DAC) configured to provide a trimmed current signal for control of the current controlled oscillator.

In accordance with an exemplary embodiment of the present invention, trim values for operation of the trim DAC can be suitably located within a trim register of flash memory, such as programmable flash memory within any mixed-signal device or system. Control of the flash memory can be provided through any conventional processor device. Programming of the flash memory can allow for accurate trimming values to be stored, thus enabling flash trimming by the trim DAC to very accurately control the center frequency of the current controlled oscillator.

In accordance with an exemplary embodiment, a temperature sensor can be configured within a feedback path of the processor device to facilitate lower temperature drift of the output frequency of the current controlled oscillator circuit. In addition, other parameters can be suitably monitored for adjustment of the trimmed correction signal provided to the current controlled oscillator.

In accordance with an exemplary embodiment, an exemplary PLL circuit can also be configured with the current controlled oscillator to operate within a wide frequency range divided into a lower frequency range and a higher frequency range, each having a target frequency within. As a result, a lower or higher frequency range can be initially selected, followed by finer frequency control of each target frequency through trimming operation of the trim DAC.

BRIEF DESCRIPTION OF THE DRAWING FIGURES

A more complete understanding of the present invention may be derived by referring to the detailed description and claims when considered in connection with the Figures, where like reference numbers refer to similar elements throughout the Figures, and:

DETAILED DESCRIPTION

The present invention may be described herein in terms of various functional components and various processing steps. It should be appreciated that such functional components may be realized by any number of hardware or structural components configured to perform the specified functions. For example, the present invention may employ various integrated components, e.g., buffers, supply rail references, filtering devices, and the like, comprised of various electrical devices, e.g., resistors, transistors, capacitors, diodes and the like whose values may be suitably configured for various intended purposes. In addition, the present invention may be practiced in any integrated circuit application where accurate output frequencies are desired, and the mixed-signal devices illustrated herein are merely for exemplary purposes. Further, it should be noted that while various components may be suitably coupled or connected to other components within exemplary circuits, such connections and couplings can be realized by direct connection between components, or by connection through other components and devices located therein between.

In accordance with various aspects of the present invention, a method and circuit for frequency synthesis using a low drift current controlled oscillator configured to provide a wide output frequency range are realized. An exemplary frequency synthesis circuit is configured for programmable control of a center frequency of the current controlled oscillator to provide a wide range of output frequencies with high accuracy.

Figure 1:
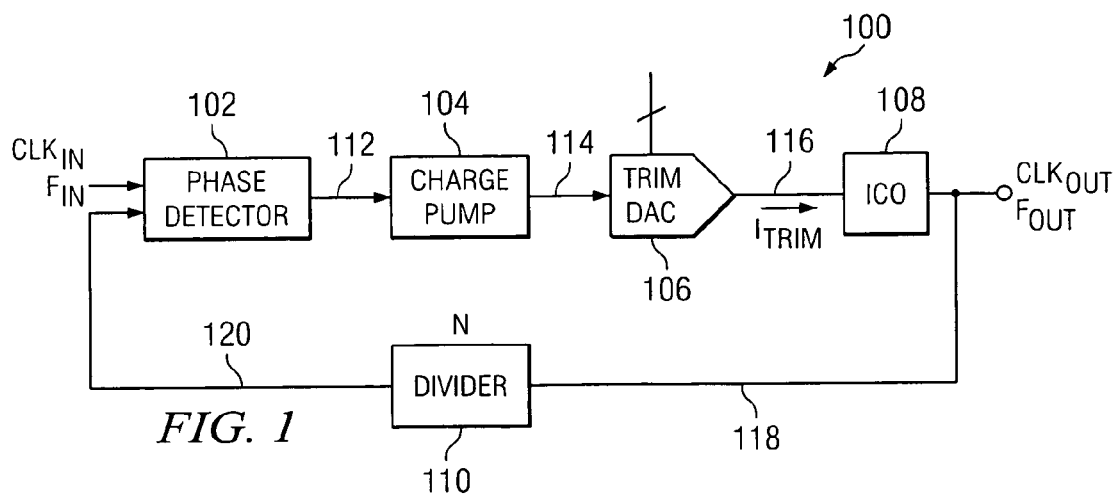
FIG. 1 illustrates a block diagram of an exemplary PLL circuit in accordance with an exemplary embodiment of the present invention.

In accordance with an exemplary embodiment of the present invention, with reference to FIG. 1, an exemplary frequency synthesis circuit comprises a phase-locked loop (PLL) circuit 100 comprising a phase detector 102, a charge pump 104, a current controlled oscillator 108 and a divider circuit 110. To facilitate a wide output frequency range, PLL circuit 100 further comprises a trim digital-to-analog converter (DAC) 106 configured for programmable control of current controlled oscillator 108.

Phase detector 102 is configured to receive an input clock signal $CLK_{IN}$ at a given frequency $f_{IN}$ and compare input clock signal $CLK_{IN}$ with a feedback representation signal 120 of an output clock signal $CLK_{OUT}$ to generate an output correction signal 112. In particular, phase detector 102 detects the phasing, i.e., the rising and/or falling edges, of clock signals $CLK_{IN}$ and feedback representation signal 120 and generates output correction signal 112 that is proportional to the distance between the respective edges. Phase detector 102 can comprise any phase detector configuration for use in PLL circuits. Charge pump 104 is configured to receive output correction signal 112 that may include a noisy AC characteristic and filter that signal to generate a steady-state DC output signal 114 for driving current controlled oscillator 108. Charge pump 104 can comprise any charge pump configuration or other like supply configured for providing a steady, averaged correction signal 114. In addition, charge pump 104 is configured for providing a nominal steady-state current without any external clock signal being provided, thus driving current controlled oscillator at all times. Current controlled oscillator 108 is configured to generate output clock signal $CLK_{OUT}$ at an output frequency $f_{OUT}$, such as for use by a central processing unit (CPU), and provide a feedback signal 118 for divider circuit 110. Current controlled oscillator 108 can comprise any current controlled oscillator configuration for use in PLL circuits.

Divider circuit 110 comprises a clock divider that receives feedback signal 118 and provides feedback representation signal 120 of an output clock signal $CLK_{OUT}$, and can comprise any clock divider configuration for use in PLL circuits. With divider circuit 110 configured within the PLL loop, output frequency $f_{OUT}$ will equal N times input frequency $f_{IN}$, i.e., $f_{OUT}=N\times f_{IN}$. Thus, for example with an input clock signal $CLK_{IN}$ generated from a crystal oscillator having an input frequency $f_{IN}$ of 32 kHz, with an N=1000, output frequency $f_{OUT}$ will equal approximately 32 MHz.

Figure 2:
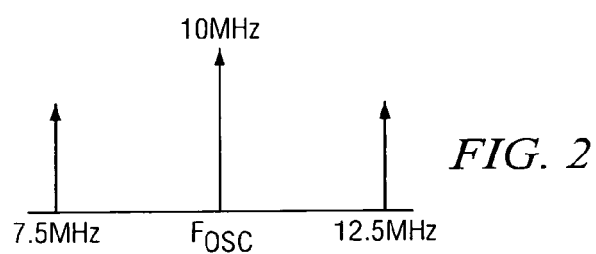
FIG. 2 illustrates an exemplary frequency range for an oscillator circuit.

For initial "input clock-free" operation of current controlled oscillator 108 within PLL circuit 100, current controlled oscillator 108 is also configured to operate in a free-running mode having a selected free-running or center frequency $f_{OSC}$, i.e., current controlled oscillator 108 is configured to operate without any correction signal 114 from charge pump 104 and outside the phase-locked loop of PLL circuit 100, such as that generated from input clock signal $CLK_{IN}$, but instead utilizes only a nominal current signal. Stated another way, in such a free-running mode, charge pump 104 provides a nominal steady-state current even when no input clock signal $CLK_{IN}$ is provided to phase detector 102. PLL circuit 100 and/or current controlled oscillator 108 are configured to provide output frequency $f_{OUT}$ within a desired tolerance of free-running frequency $f_{OSC}$, such as for example within approximately 25%. For example, with additional reference to FIG. 2, for free-running frequency $f_{OSC}$ equal to approximately 10 MHz, with a nominal tolerance or locking range of 25%, current controlled oscillator 108 can be configured to lock onto frequencies within a range of +/−2.5 MHz of free-running frequency $f_{OSC}$, or within 7.5 MHz and 12.5 MHz. Such a range of output frequencies suitably defines the boundaries for PLL circuit 100 to operate. Thus, in order to provide a wider range of frequencies for PLL circuit 100 to operate, current controlled oscillator 108 also needs to be readily reconfigurable to provide such a wide range of output frequencies.

To facilitate a wider output frequency range, current controlled oscillator 108 is configured with programmable control. In accordance with the exemplary embodiment, PLL circuit 100 further comprises a trim digital-to-analog converter (DAC) 106 configured to provide a trimmed current signal $I_{TRIM}$ based on correction signal 114 produced from charge pump 104 to enable programmable control of current controlled oscillator 108. Trimmed current signal $I_{TRIM}$ is configured to suitably control center frequency $f_{OSC}$ of oscillator 108 to allow for a wider range of operation. Trim DAC 106 can comprise any conventional DAC configuration for providing trimmed signals to another device.

Figure 3:
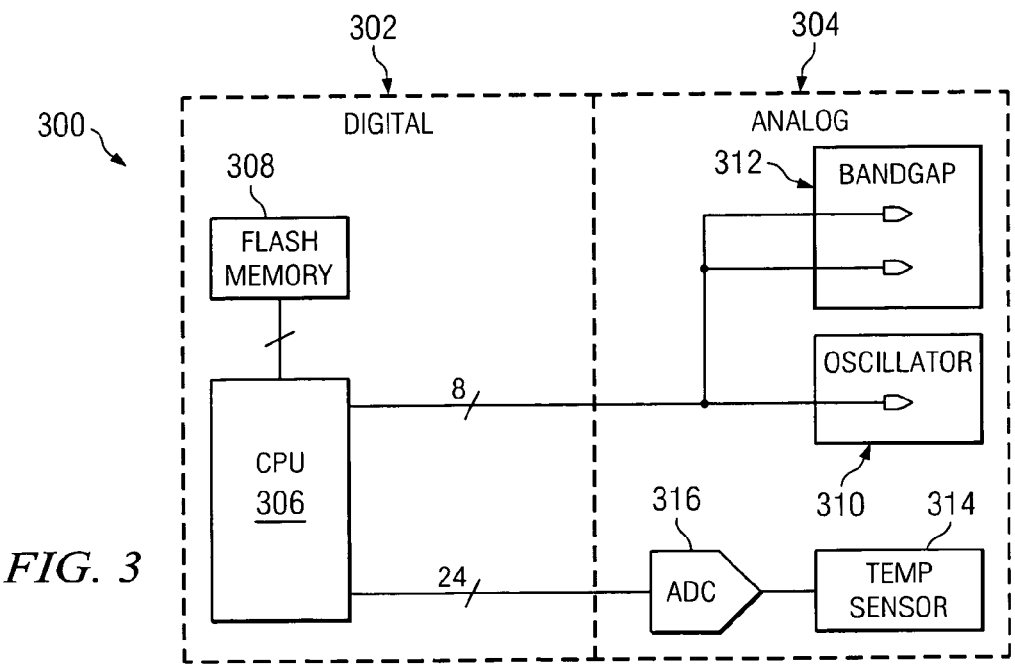
FIG. 3 illustrates a block diagram of an exemplary mixed-signal circuit comprising flash memory in accordance with an exemplary embodiment of the present invention.

In accordance with an exemplary embodiment of the present invention, trim values for operation of trim DAC 106 can be suitably stored within a trim register of flash memory, such as programmable flash memory within any mixed-signal device or system. For example, with additional reference to FIG. 3, a microprocessor-based system 300 can comprise digital circuitry 302 and analog circuitry 304. Digital circuitry 302 can include a central processing unit (CPU) 306 and resident flash memory 308, while analog circuitry 304 can include an oscillator circuit 310, comprising such devices as trim DAC 106 and ICO 108. Analog circuitry 304 can also comprise a bandgap reference cell 312 configured for providing reference voltage and reference current to oscillator circuit 310, with oscillation circuit 310 being insensitive to variations in bandgap reference cell 312.

Control of flash memory can be provided by CPU 306, which can comprise any conventional processor device, or any other manner for control of flash memory. In the exemplary embodiment, trim values comprise an 8-bit code that can be suitably written to a system page of flash memory 308, e.g., within an 8-bit trim register, for use in providing trim signal $I_{TRIM}$ from trim DAC 106. The size of the trim register is not limited to 8-bits and can comprise any size less than or greater than 8-bits for programming of flash memory, depending on desired trim resolution. In addition, the trim values can be suitably stored in any manner, such as look-up tables and the like. Programming of flash memory 308 allows for storage of accurate trimming values, thus enabling CPU 306 to facilitate flash trimming by trim DAC 106 to very accurately control center frequency $f_{OSC}$ of the current controlled oscillator 108.

In addition to retrieving trim values from a trim register within flash memory 308, the trim values can also be stored in other manners, such as through any look-up tables or other memory devices or applications. Further, trim signal $I_{TRIM}$ can also be suitably adjusted based on other operating parameters. For example, in accordance with an exemplary embodiment, a temperature sensor 314 within analog circuit 304 can be configured within a feedback path of CPU 306 to facilitate lower temperature drift of output frequency $f_{OUT}$ of current controlled oscillator circuit 108. Temperature sensor 314 can suitably comprise an on-chip temperature sensor, or any other temperature sensor circuit or device, configured for detecting various temperature conditions that can affect operation of ICO 108. Temperature sensor 314 can also comprise a resident temperature sensor within a microprocessor application that provides various temperature measurement related functions for other components and applications, or a dedicated temperature sensor for adjustment of trim signal $I_{TRIM}$ based on temperature variations.

Analog output signals from temperature sensor 314 can be suitably provided to an ADC 316 for conversion to a digital signal, e.g., a 24-bit signal, for CPU 306. In some instances, the temperature drift of an ICO can reach approximately 10% or more over the full temperature range, e.g., a variation of 10% over a range of between approximately −40 degrees Celsius up to approximately +85 degrees Celsius. However, by monitoring the temperature with temperature sensor 314 and CPU 306, and determining the temperature deviation from a nominal value such as room temperature, correction codes can be generated and included within a composite trim signal $I_{TRIM}$ for controlling current controlled oscillator 108. Such correction codes can be generated in various manners, such as for example by accessing a look-up table having stored correction codes corresponding to various temperature deviations from a nominal temperature, or any other like manner for generating and retrieving stored information. As a result, output frequency $f_{OUT}$ can be provided from current controlled oscillator 108 with very low temperature drift over a given operating temperature range, such as over a range of between approximately −40 degrees Celsius up to approximately 85 degrees Celsius.

In addition to temperature, other parameters can be suitably monitored by CPU 306 to provide additional adjustment and/or correction codes to generate a composite trim signal $I_{TRIM}$ for controlling ICO 108. For example, supply voltage variations can also affect the nominal current generated from charge pump 104 during free-running mode. Such supply voltage variations can be sensed with minimal external circuitry and digitized by ADC 316. Trim signal $I_{TRIM}$ can be suitably adjusted to address changes or variations for this additional monitored parameter.

The various additional trimming adjustments provided to trim signal $I_{TRIM}$ can suitably adjust the center frequency of current controlled oscillator 108, enabling a wide range of operating frequencies that can be realized within PLL 100. In addition, high stability can also be achieved due to the negative feedback configuration of PLL circuit 100. For example, during power-up of microcontroller circuit 300, a nominal drive current is provided from charge pump 104 through trim DAC 106 to current controlled oscillator 108 to allow operation at the center frequency, e.g., at a frequency of 14 MHz. Such a center frequency can be achieved through appropriate trimming of trim signal $I_{TRIM}$ based on flash memory trim values stored in flash memory 308 and/or other correction codes based on various parameters such as temperature. Accordingly, if the operating frequency drifts due to temperature changes, trim signal $I_{TRIM}$ can be suitably adjusted based on changes detected by temperature sensor 310 to obtain the desired output frequency $f_{OUT}$, thus maintaining stability within PLL circuit 100.

In accordance with an exemplary embodiment, an exemplary PLL circuit 100 can also be configured with current controlled oscillator 108 to operate within an even wider frequency range, such as one divided into at least two portions, e.g., a lower frequency range and a higher frequency range, with each portion having a target frequency within. For example, in accordance with an exemplary embodiment, charge pump 104 can be suitably configured with a gain function to allow operation at different center frequencies for current controlled oscillator 108. Such a gain function can enable for center frequency of current controlled oscillator 108 to be suitably adjusted from lower to higher target frequencies, such as from a target frequency of 14 MHz to a higher target frequency of 28 MHz in an instance where the gain G=2. Once a lower or higher frequency range is selected, the finer frequency control of each target frequency can be achieved through trimming operation of trim DAC 106 as discussed above.

Figure 4:
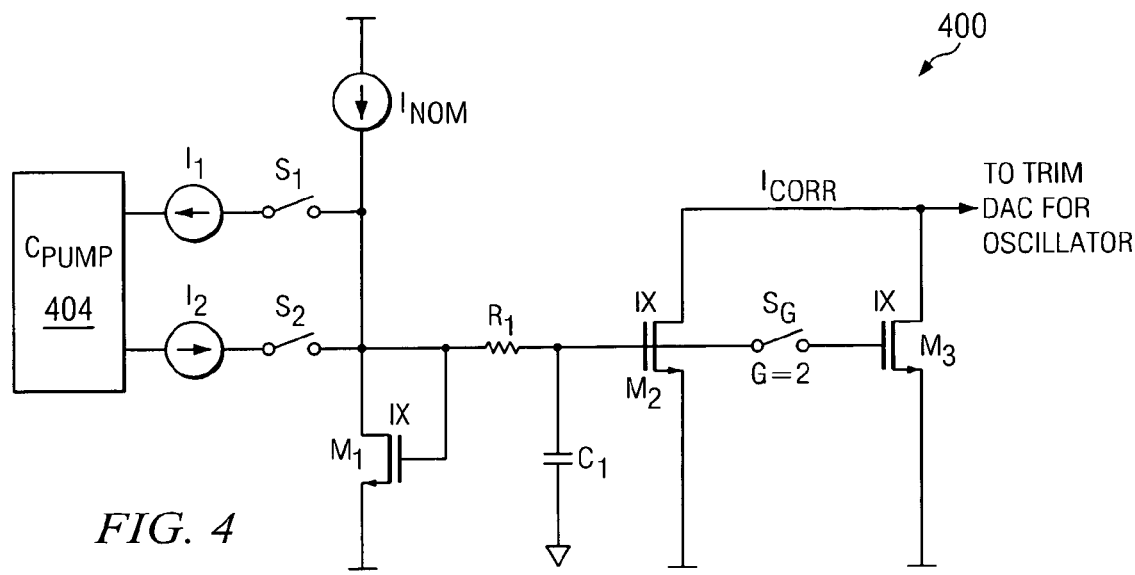
FIG. 4 illustrates a schematic diagram of an exemplary gain circuit in accordance with an exemplary embodiment of the present invention.

With reference to FIG. 4, in accordance with an exemplary embodiment, a gain circuit 400 for use with a charge pump 404 to provide a correction signal $I_{CORR}$ to trim DAC 106 is illustrated. Gain circuit 400 suitably comprises current sources $I_1$ and $I_2$ configured with switches $S_1$ and $S_2$ and coupled to a nominal current source $I_{NOM}$ such as may be used for providing nominal current during free-running mode of current controlled oscillator 108, i.e., when current controlled oscillator 108 is not operating with the phase-locked loop of PLL circuit 100 (such as when microcontroller system 300 uses only internal oscillator circuit 310 without the phase-locked loop of PLL circuit 100). Switches $S_1$ and $S_2$ are controlled by correction signals 112 of phase detector 102, and are configured "open" during free-running mode of current controlled oscillator 108 when no input clock signal $CLK_{IN}$ is received. A biasing device comprising MOSFET device $M_1$ can be configured to provide a bias voltage through a filter comprising resistor $R_1$ and capacitor $C_1$ to MOSFET devices $M_2$ and $M_3$. In the exemplary embodiment, MOSFET devices $M_1$, $M_2$ and $M_3$ comprise size 1X devices, but can be suitably scaled to any other size devices depending upon desired performance and other gain considerations. In addition, a gain switch $S_G$ is configured between biasing device $M_1$ and a control terminal of gain device $M_3$.

During operation, such as initial start-up without any input clock signal $CLK_{IN}$, i.e., the free-running mode, and with gain switch $S_G$ in an "open" position, device $M_2$ will be biased "on" and nominal current $I_{NOM}$ will flow through to trim DAC 106 to allow for suitable trimming of nominal current $I_{NOM}$ to obtain an output clock frequency $f_{OUT}$ of 14 MHz. Thus, for a center frequency of 14 MHz for current controlled oscillator 108, gain circuit 400 will be configured to operate with trim DAC 106 to provide nominal current $I_{NOM}$ such that a target output frequency of 14 MHz can be realized.

Figure 5:
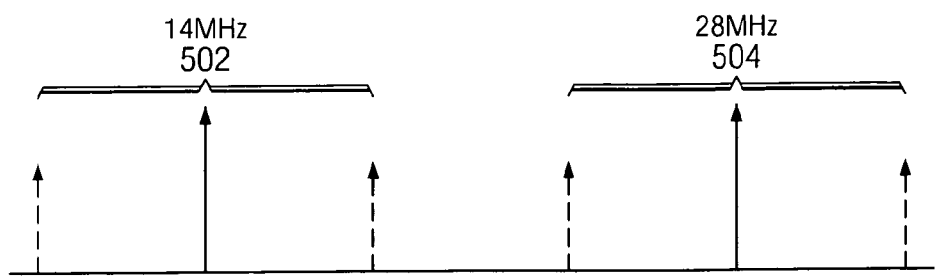
FIG. 5 illustrates exemplary lower and higher frequency ranges for a low drift, current controlled oscillator circuit in accordance with an exemplary embodiment of the present invention.

When used in PLL mode, switches $S_1$ and $S_2$ receive correction signals 112 from phase detector 102 and either add or subtract current to nominal current $I_{NOM}$ thus increasing or decreasing output frequency $f_{OUT}$. PLL circuit 100 attempts to maintain the time interval between rising edges seen at the inputs of phase detector 102 at a constant, i.e., locked mode. This locking range is typically +/−25% of the trimmed free running frequency. For example, with momentary reference to FIG. 5, a lower frequency range 502 can be provided for operation around a lower center frequency of 14 MHz. To the extent that a different target frequency is desired, such as approximately 13 MHz or 15 MHz, switches $S_1$ and $S_2$ can also be suitably controlled, i.e., opened and closed, to sink or source additional current from current sources $I_1$ and $I_2$, with suitable filtering from the RC filter to minimize noise being introduced due to the switching functions.

In the event that operation within a range around a much higher frequency is desired, such as one within a target frequency of 28 MHz, gain circuit 400 can be configured to provide a gained multiple of nominal current $I_{NOM}$ to provide correction signal $I_{CORR}$ to trim DAC 106. For example, for a gain G=2, gain switch $S_G$ can be suitably enabled or "closed" to also bias "on" device $M_3$, thus providing twice the value of nominal current $I_{NOM}$ for correction signal $I_{CORR}$. As a result, a gain of two in output clock frequency $f_{OUT}$ of approximately 28 MHz for current controlled oscillator 108 can be realized. Accordingly, once PLL circuit 100 receives an input clock signal $CLK_{IN}$, and/or temperature or other variations exist, trim DAC 106 can suitably provide a trimmed signal $I_{TRIM}$ to enable current controlled oscillator 108 to operate within a wide range of frequencies. For example, with momentary reference to FIG. 5, a higher frequency range 504 can be provided for operation around a higher center frequency of 28 MHz. Accordingly, for an ICO trimming range of approximately 30–50%, and target frequencies of 14 MHz and 28 MHz, a first frequency range of between approximately 9 to 20 MHz and a second frequency range of between approximately 18 to 36 MHz can be realized. In addition, the target frequency can thereafter be controlled in finer step sizes, e.g., 64 kHz per step, based on an 8-bit trim register configuration within the flash memory.

While the exemplary embodiment comprises a gain G=2, gain circuit 400 can also be suitably arranged with other gain configurations, such as by including additional MOSFET devices and gain switches in parallel with devices $M_2$ and $M_3$. Thus, for example, at least three or more target frequency ranges can be realized. In accordance with other exemplary embodiments, gain switch SG could be suitably replaced with another trim DAC, thus allowing for a wider range of variability.

The present invention has been described above with reference to an exemplary embodiment. However, those skilled in the art will recognize that changes and modifications may be made to the exemplary embodiment without departing from the scope of the present invention. For example, the various components may be implemented in alternate ways, such as, for example, by replacing the flash memory with any other type of memory capable of storing trim values, by including an additional dedicated CPU or other like changes. These alternatives can be suitably selected depending upon the particular application or in consideration of any number of factors associated with the operation of the system. These and other changes or modifications are intended to be included within the scope of the present invention, as expressed in the following claims.

The invention claimed is:

1. A PLL circuit comprising:
   a phase detector configured to receive an input clock signal and a feedback signal and generate an output correction signal;
   a charge pump configured for receiving said output correction signal and for generating a nominal current signal;
   a current controlled oscillator configured to receive a DAC output current and to generate an output clock signal;
   a divider circuit configured to receive said output clock signal and provide a feedback signal to said phase detector; and
   a trim DAC coupled between said charge pump and said current controlled oscillator, said trim DAC configured to provide said DAC output current based on said nominal current signal received by said trim DAC.

2. A PLL circuit according to claim 1, wherein said trim DAC provides a trimmed DAC output current to programmably control a center frequency of said output clock signal.

3. A PLL circuit according to claim 1, wherein said trim DAC can be trimmed through use of trim values stored within flash memory.

4. A PLL circuit according to claim 3, wherein said flash memory stores trim correction codes operable to enable said PLL circuit to achieve a desired center frequency during startup.

5. A PLL circuit according to claim 1, wherein said DAC output current can be adjusted based on a temperature correction signal corresponding to deviations in temperature of said current controlled oscillator.

6. A PLL circuit according to claim 1, wherein said charge pump circuit comprises a gain circuit configured to provide at least two ranges of operation.

7. A PLL circuit according to claim 1, wherein said PLL circuit is configured to select a center frequency of said output clock signal within one of a lower frequency range and a higher frequency range, and to fine tune said center frequency through control of said current controlled oscillator by said trim DAC.

8. A PLL circuit according to claim 1, wherein said charge pump is configured to provide said nominal current signal to operate within a free-running mode.

9. The PLL circuit according to claim 1, wherein said PLL circuit is contained in a microcontroller system.

10. A current controlled oscillator circuit having an output frequency range, said current controlled oscillator circuit comprising:
    a current controlled oscillator configured to generate an output clock signal having a selected center frequency; and
    a trim DAC configured for control of said current controlled oscillator by providing a trimmed current signal to programmably control said center frequency wherein said trim DAC can trim said trimmed current signal through use of trim values stored within flash memory.

11. The current controlled oscillator circuit according to claim 10, wherein said trimmed current can be further adjusted based on a temperature correction signal corresponding to deviations in temperature of said current controlled oscillator.

12. The current controlled oscillator circuit according to claim 11, wherein said current controlled oscillator circuit is contained in a microcontroller system.

13. The current controlled oscillator circuit according to claim 12, wherein said microcontroller system comprises an ADC (analog-to-digital converter).

14. A method for providing a wide output frequency range within an oscillator circuit, said method comprising:
    generating an output clock signal from a current controlled oscillator; and programmably controlling said current controlled oscillator with a trim DAC to adjust a center frequency of said current controlled oscillator wherein control of said oscillator comprises generating at least two ranges of operation from a gain circuit within a charge pump.

15. The method according to claim 14, wherein said programmably controlling with said trim DAC comprises providing a trimmed current signal to said oscillator circuit.

16. The method according to claim 15, wherein said providing said trimmed current signal to said oscillator circuit comprises trimming through values stored within flash memory.

17. The method according to claim 15, wherein said trimmed current signal is adjusted based on a temperature correction signal corresponding to deviations in temperature of said current controlled oscillator.

18. The method according to claim 14, wherein said method further comprise selecting a center frequency of said oscillator circuit within one of a lower frequency range and a higher frequency range, and fine tuning said center frequency through control of said oscillator by said trim DAC.

19. A microcontroller-based system comprising:
a central processing unit;
a flash memory module; and
an oscillator circuit configured for providing a wide output frequency range, said oscillator circuit comprising:
a current controlled oscillator configured to generate an output clock signal having a first center frequency; and
a trim DAC configured for control of said current controlled oscillator by providing a trimmed current signal to programmably control said first center frequency.

20. The microcontroller-based system according to claim 19, wherein said wherein said trim DAC can trim said trimmed current signal through use of trim values stored within flash memory.

21. The microcontroller-based system according to claim 20, wherein said trimmed current can be further adjusted based on a temperature correction signal corresponding to deviations in temperature of said current controlled oscillator.

* * * * *